(12) United States Patent
Fahmy et al.

(10) Patent No.: US 7,106,610 B2
(45) Date of Patent: Sep. 12, 2006

(54) HIGH SPEED MEMORY INTERFACE

(75) Inventors: Hany M. Fahmy, Sacramento, CA (US); Woong H. Ryu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 269 days.

(21) Appl. No.: 10/676,533

(22) Filed: Sep. 30, 2003

(65) Prior Publication Data

US 2005/0068800 A1    Mar. 31, 2005

(51) Int. Cl.
*G11C 5/06* (2006.01)
*G11C 7/00* (2006.01)

(52) U.S. Cl. .......................... 365/63; 365/101

(58) Field of Classification Search .................. 365/63, 365/51, 101
See application file for complete search history.

(56) References Cited

U.S. PATENT DOCUMENTS 6,157,688 A * 12/2000 Tamura et al. .............. 375/348
6,661,092 B1 * 12/2003 Shibata et al. .............. 257/724
6,745,268 B1 * 6/2004 Greeff et al. ............... 710/100

* cited by examiner

*Primary Examiner*—Son T. Dinh
(74) *Attorney, Agent, or Firm*—Blakely, Sokoloff, Taylor & Zafman LLP

(57) ABSTRACT

A memory interface and a method to interface with high-speed memory devices have been disclosed. One embodiment of the memory interface includes an inductor and a number of transmission lines. The transmission lines are coupled to the inductor in series to couple a number of memory devices to a circuit board.

12 Claims, 9 Drawing Sheets

HIGH SPEED MEMORY INTERFACE

FIELD OF INVENTION

The present invention relates to memory technology, and more particularly, to improving timing and noise margin of high speed memory interfaces.

BACKGROUND

A double data rate (DDR) synchronous dynamic random access memory (SDRAM) was introduced as a new evolutionary dynamic random access memory (DRAM) to provide a high-performance interface for system memory. As the DDR data rate increases, high-frequency phenomena, such as, channel resonance, inter-symbol interference (ISI), cross-talk, and simultaneous switching noise (SSN), have become critical in determining the performance of memory.

In a typical computer system, memory devices (e.g., SDRAM) are mounted on one or more dual in-line memory module (DIMM). The DIMM is then plugged into a motherboard via a DIMM connector to provide an interface between the memory and the motherboard.

FIG. 1 shows an existing DIMM. The interface includes a number of transmission lines 130, also known as traces, coupling a DIMM connector 110 to a number of SDRAM devices 120. In addition to the transmission lines 130, a resistor 140 is coupled in series with the transmission lines 130 to provide a signal path from the DIMM connector 110 to the SDRAM devices 120. The connector 110, the transmission lines 130, and the resistor 140 may be fabricated on a printed circuit board. The existing DIMM has a relatively low slew rate and low voltage swing margin at a high frequency, such as, 300 MHz, because the SDRAM device parasitic, such as parasitic inductance and parasitic capacitance, limits the signal gain of the interface. As a result, the signal quality is worsened.

Furthermore, to predict the performance in high-frequency phenomena, and consequently, to improve the memory channel, series of time domain analysis and simulations are performed to design a memory interface. As the memory interface becomes more and more complex, the large amount of time-domain simulation takes a long time to complete. To compete efficiently in the market, the design time of memory interface has to be shortened in order to provide customers with the memory interface sooner.

BRIEF DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Figure 1:
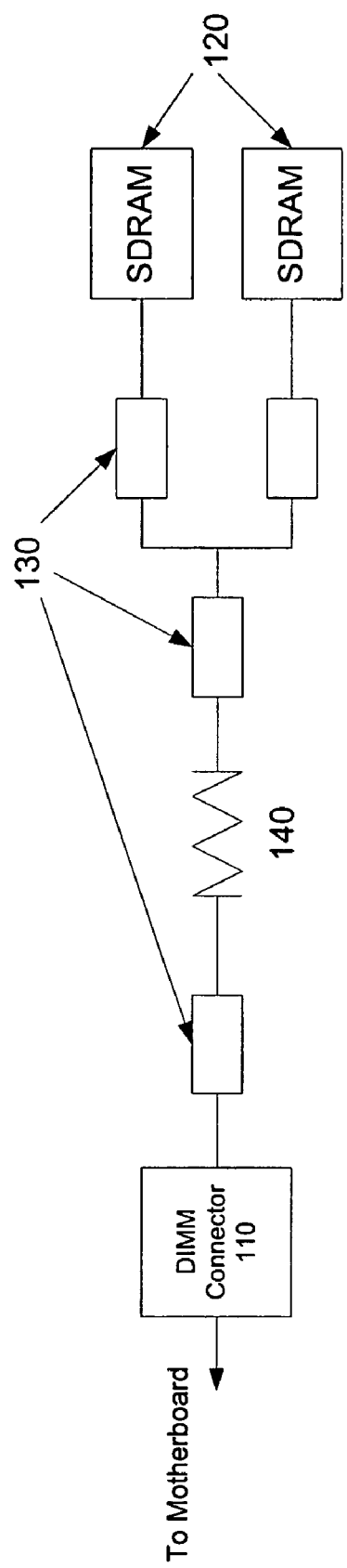
FIG. 1 shows an existing memory interface.
Figure 2A:
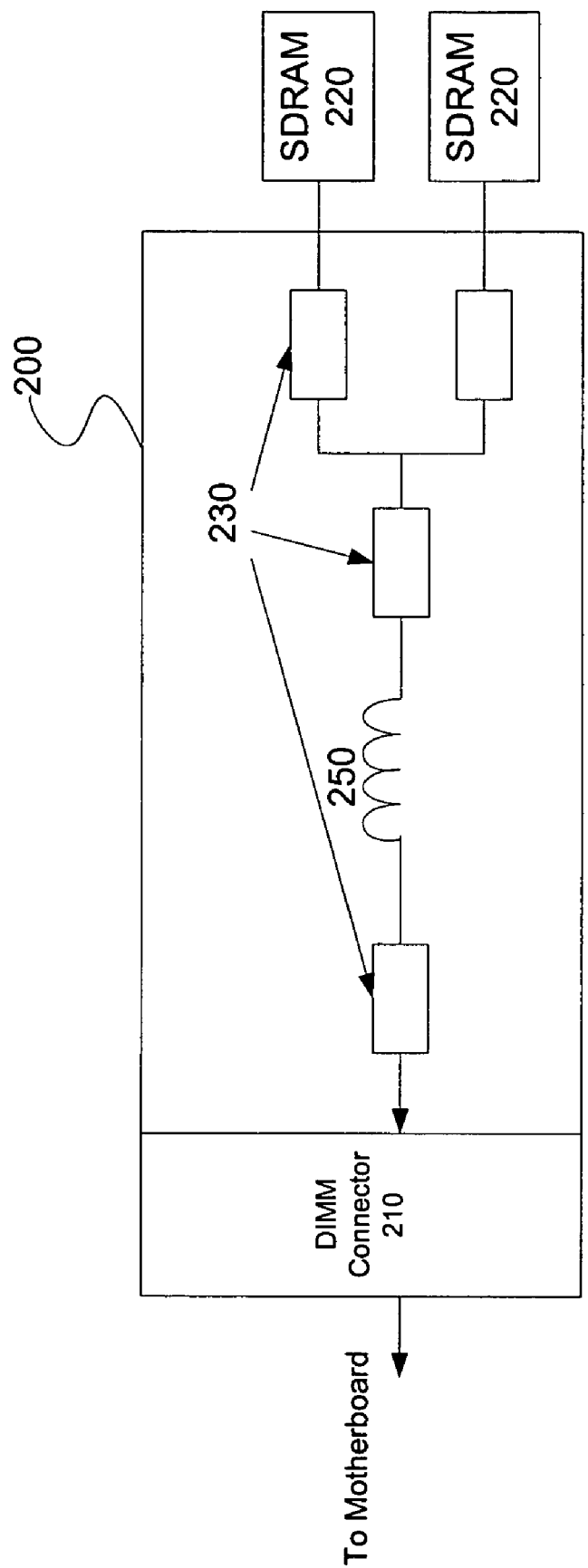
FIG. 2A shows one embodiment of a memory interface.

FIG. 2A shows one embodiment of a memory interface. In one embodiment, the memory interface 200 is a DIMM. The memory interface 200 includes a DIMM connector 210, a number of transmission lines 230, and an inductor 250. In one embodiment, the inductor 250 is coupled to the transmission lines 230 in series. The DIMM connector 210 is coupled to the SDRAM devices 220 by the transmission lines 230 and the inductor 250. The DIMM connector 210 is coupled to a circuit board (not shown) to interface the circuit board with the SDRAM devices 220. In one embodiment, the circuit board is a motherboard in a computer system. In one embodiment, the inductor 250 increases the impedance of the memory interface 200. As a result, the signal gain through the interface 200 is increased to provide greater overshoot and undershoot margins. Furthermore, due to the small impedance of the SDRAM devices 220, there is a big negative reflection that reduces the gain bandwidth, especially at high frequency (e.g., 200 MHz or above). Therefore, coupling the inductor 250 to the transmission lines 230 provides greater impedance to improve the overall signal quality.

Referring to FIG. 2A, the memory interface 200 is shown coupled to a number of SDRAM devices 220. However, one should appreciate that the technique is applicable to other memory interface for different types of memory as well, such as, for example, dynamic random access memory (DRAM), flash memory, etc. In one embodiment, the SDRAM devices 220 include a double-data rate (DDR) SDRAM. In one embodiment, the speed of the DDR SDRAM is between 300 and 500 MHz. In an alternate embodiment, the speed of the DDR SDRAM is between 200 and 400 MHz. For a high speed memory interface, increasing the overshoot and undershoot margins is important because signal quality is more susceptible to channel resonance, inter-symbol interference (ISI), cross-talk, and simultaneous switching noise (SSN) at high speed.

In one embodiment, the inductor 250 has an inductance of 10 nH. In an alternate embodiment, the inductor 250 has an inductance of 8 nH. One should appreciate that inductors of various inductances can be used, depending on a variety of factors, such as, the frequency of operation, the dimensions of the transmission lines, the signal slew rate required, etc. Furthermore, it should be apparent that multiple inductors may be used to practice some embodiments of the present invention instead of a single inductor.

Referring to FIG. 2A, the DIMM connector 210 couples the memory interface 200 to a computer motherboard (not shown). In one embodiment, the DIMM connector 210 is part of the memory interface 200. Alternatively, the DIMM connector is external to the memory interface. However, in an alternate embodiment, the memory interface is integrated with a computer motherboard, and thus, eliminating the DIMM connector. Integrating the memory interface with the motherboard is also referred to as a chip on board (COB) design.

In addition to or as an alternative to using the inductor 250, one may vary the dimension of one or more of the transmission lines 230 to increase the impedance of the memory interface 200. The relationship between the impedance and the dimension of the transmission lines 230 depends on the fabrication process. For example, using an exemplary fabrication process, the impedance of a 7 mil wide transmission line is 50 ohms. The transmission line may be narrowed to 4 mil to provide an impedance of 60 ohms, or be further narrowed to 3.5 mil to provide an impedance of 67 ohms.

Figure 2B:
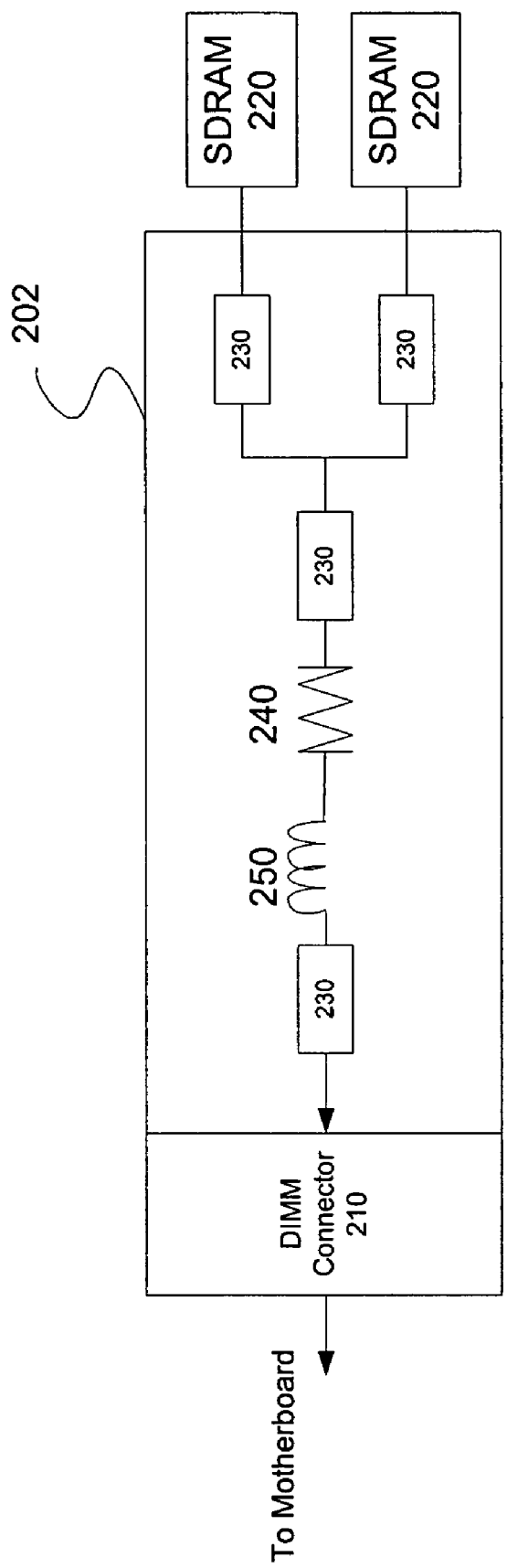
FIG. 2B shows another embodiment of a memory interface.

FIG. 2B shows one embodiment of a memory interface. The memory interface 202 includes a number of transmission lines 230, an inductor 250, and a resistor 240. Both inductor 250 and the resistor 240 are coupled in series with the transmission lines 230. In one embodiment, the interface 202 couples a number of SDRAM devices 220 to a DIMM connector 210, which is further coupled to a computer motherboard. Using the inductor 250 to partially provide the impedance of the memory interface 202 reduces the negative reflection of the interface 202, and hence, increases the signal gain through the interface 202, as well as the overshoot and undershoot margins.

Figure 2C:
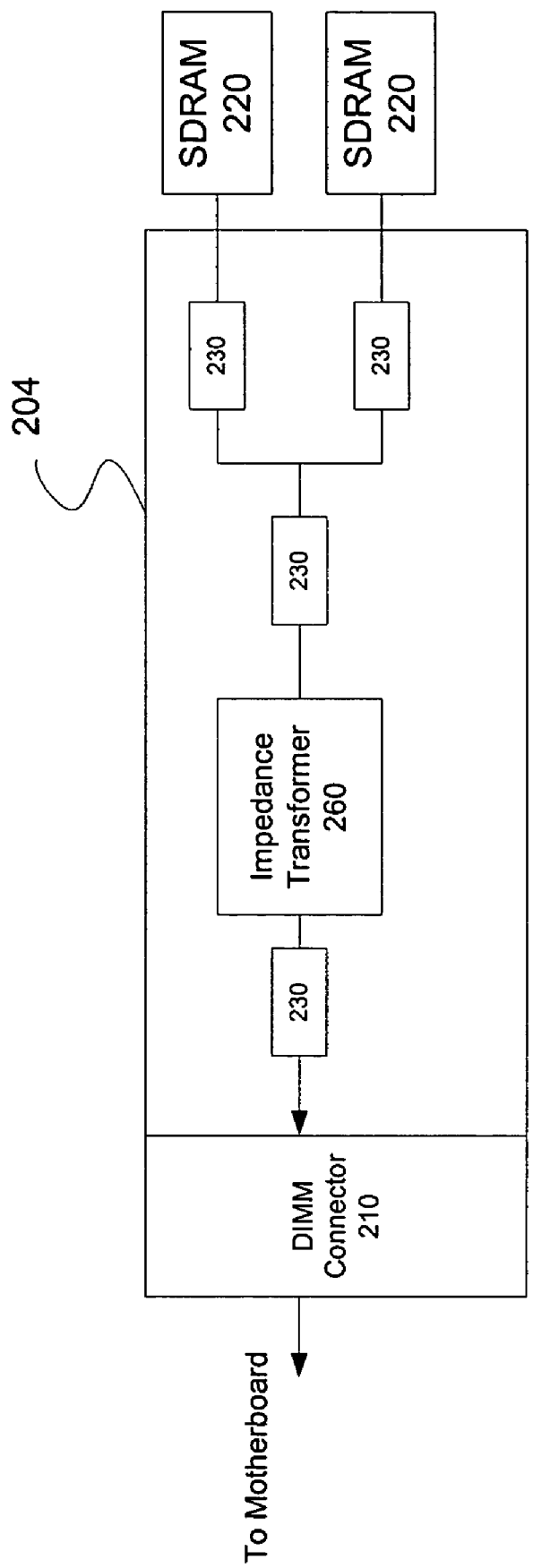
FIG. 2C shows one embodiment of a memory interface.

FIG. 2C shows one embodiment of a memory interface. The memory interface 204 includes a number of transmission lines 230 and an impedance transformer 260. The impedance transformer 260 provides impedance transforming of the input impedance of the SDRAMs 220. Moreover, the impedance transformer 260 may be used to increase or decrease the overall input impedance of the memory interface 204 and the SDRAMs 220 in response to the frequency of operation, and thus, allowing the memory interface 204 to interface a computer motherboard (not shown) with high speed SDRAMs 220 (or other types of high speed memory devices in general). Furthermore, since the impedance transformer 260 may increases the impedance of the memory interface 204, the impedance transformer 260 reduces the negative reflection of the memory interface 204 at high frequency (e.g., 200 MHz or above). Consequently, both the gain and the overshoot and undershoot margins of the interface 204 are increased. In one embodiment, one of the transmission lines 230 is used as an impedance transformer. The impedance transformer 260 may be a single-section or a multi-section impedance transformer.

Figure 2D:
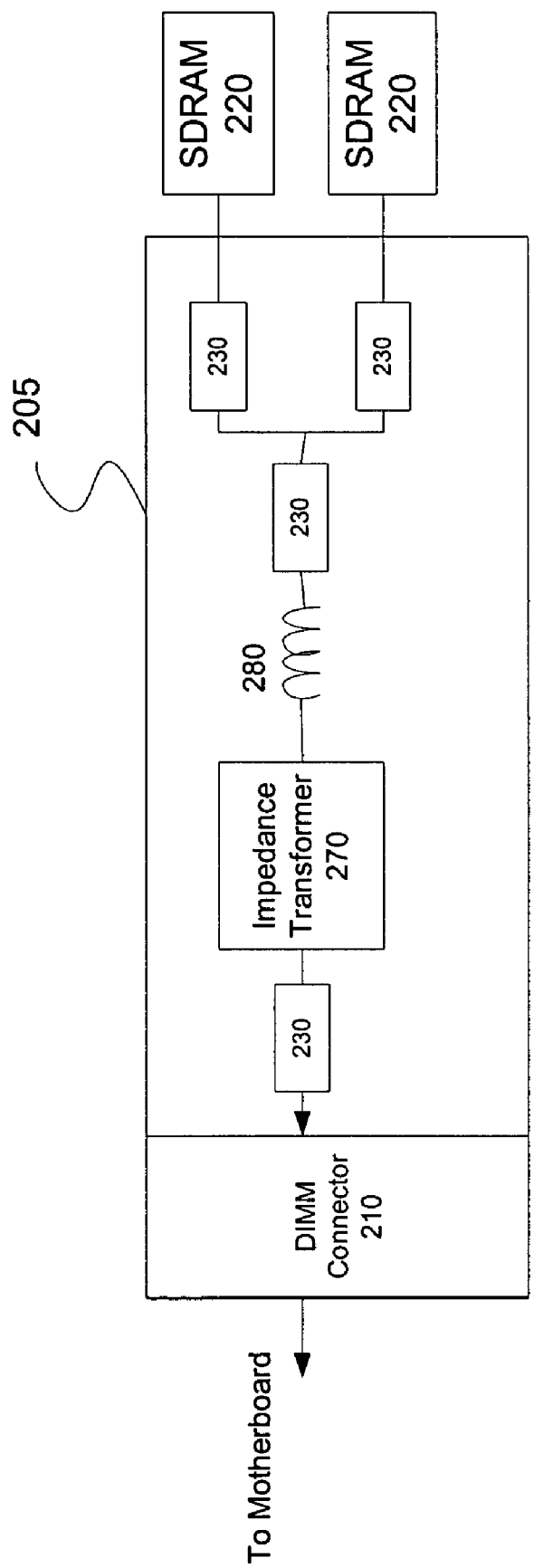
FIG. 2D shows one embodiment of a memory interface.

FIG. 2D shows one embodiment of a memory interface. The memory interface 205 includes a number of transmission lines 230, an inductor 280, and an impedance transformer 270. The inductor 280 and the impedance transformer 270 are coupled to the transmission lines 230 in series to provide more overall impedance to the memory interface 205 and the SDRAMs 220. Higher impedance reduces the negative reduction at high frequency (e.g., 200 MHz or above), and hence, increases the gain bandwidth. Furthermore, as discussed above, the impedance transformer 270 may be used to adjust the overall input impedance of the memory interface 205 and the SDRAMs 220, and therefore, allowing the memory interface 204 to interface a computer motherboard (not shown) with high speed SDRAMs 220 (or other types of high speed memory devices in general).

Figure 3:
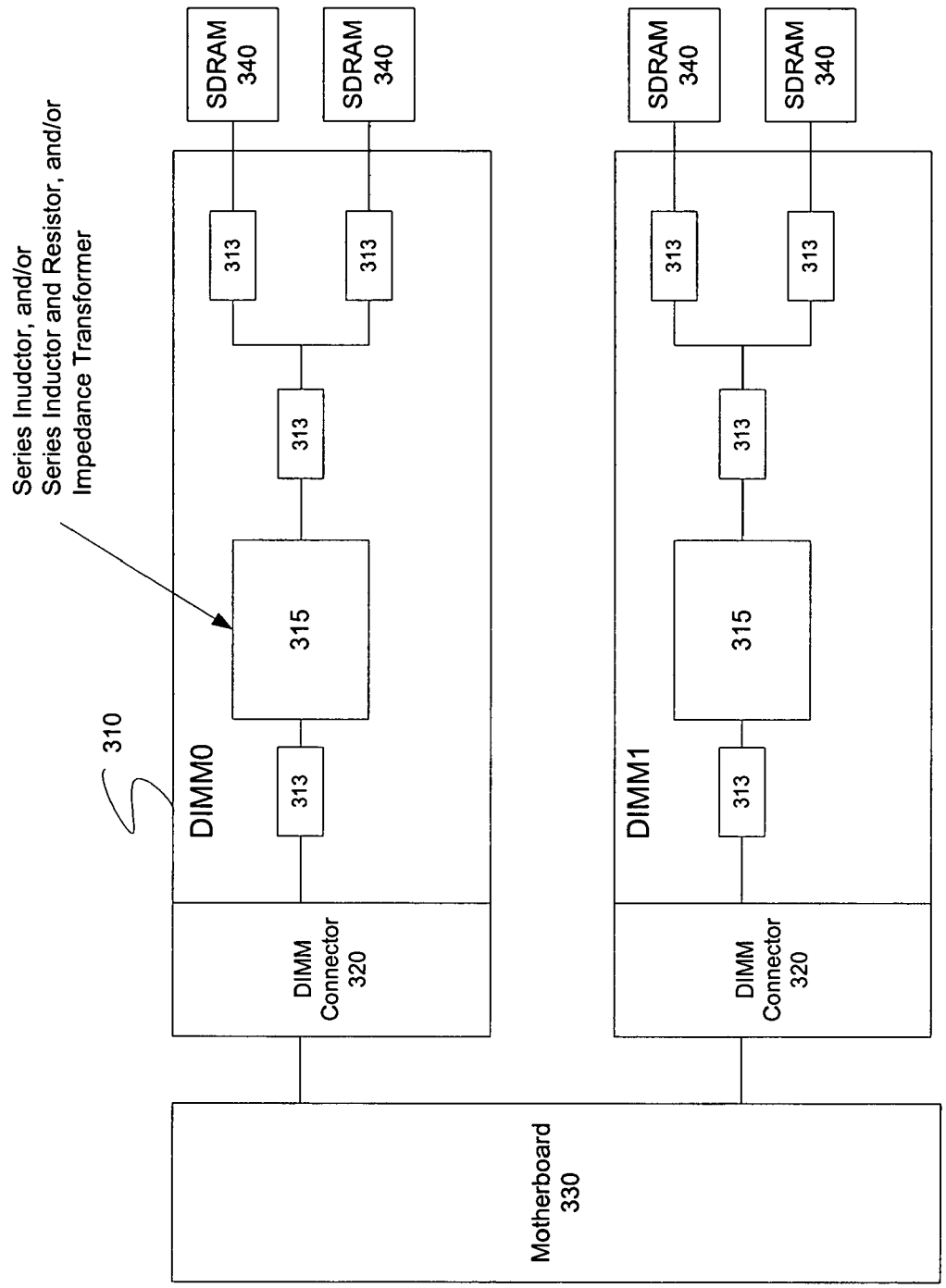
FIG. 3 shows one embodiment of a memory interface.

FIG. 3 shows one embodiment of a memory interface. The memory interface includes a number of DIMMs 310, such as, for example, DIMM0 and DIMM1. Each of the DIMMs 310 is coupled to a DIMM connector 320. The DIMM connector 320 may be integral to the DIMM 310. Via the DIMM connectors 320, the DIMMs 310 are coupled to a computer motherboard 330. The other end of each of the DIMMs 310 is coupled to a number of SDRAM devices 340.

In one embodiment, each of the DIMMs 310 includes a number of transmission lines 313 and a structure 315 to provide a certain amount of impedance. In one embodiment, the structure 315 includes an inductor coupled to the transmission lines 313 in series. The structure 315 may further include a resistor coupled to the inductor in series. In addition to or as an alternative to the inductor, the structure 315 may include a single or a multi-section impedance transformer. One should appreciate that each of the DIMMs 310 may have substantially the same configuration. Alternatively, each of the DIMMs 310 may have a distinct configuration depending on the characteristics of the SDRAM devices 340 to which the DIMM 310 is interfacing with.

Figure 4A:
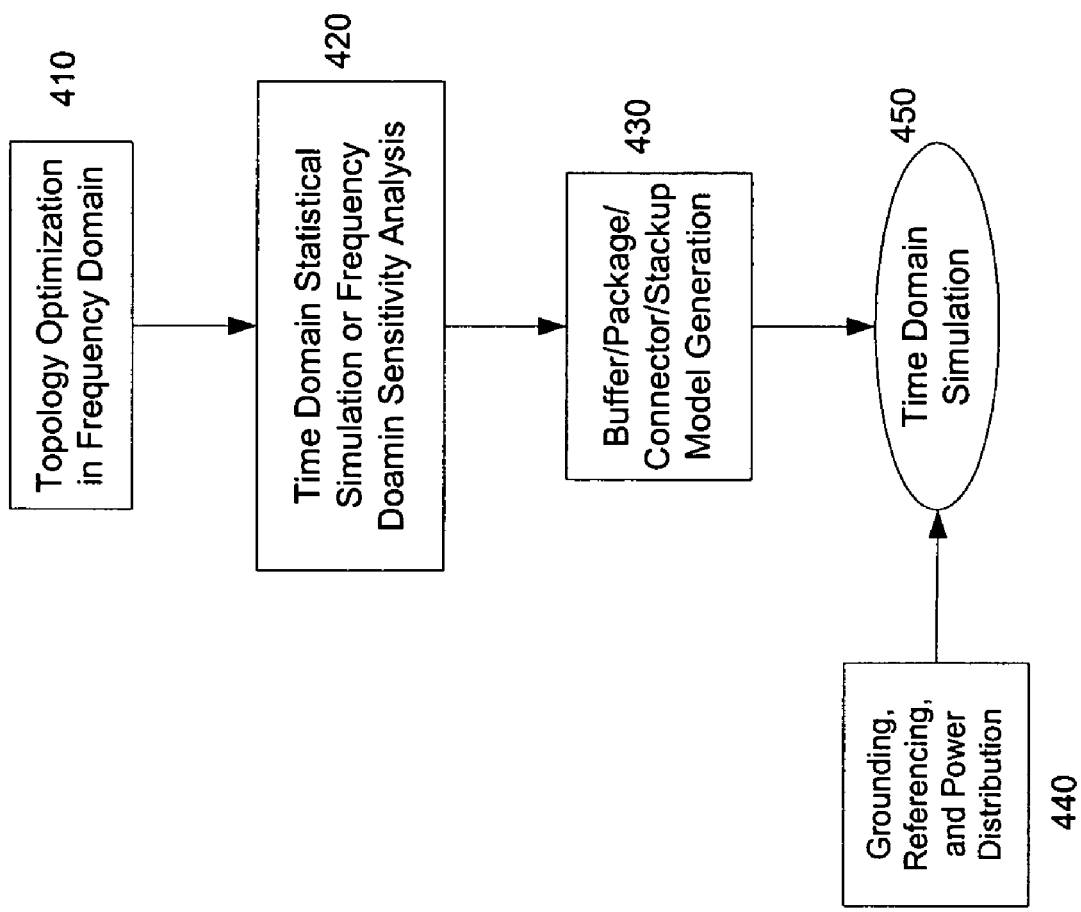
FIG. 4A shows a flow diagram of one embodiment of a process for designing a memory interface.

FIG. 4A shows one embodiment of a process for running simulations to design a memory interface. The process is performed by processing logic that may comprise hardware (e.g., circuitry, dedicated logic, etc.), software (such as is run on a general purpose computer system or a dedicated machine), or a combination of both. Processing logic first performs topology optimization in frequency domain (processing block 410). Then processing logic performs time domain statistical simulation or sensitivity analysis in frequency domain on the result from processing block 410 (processing block 420). Details of both processing blocks 410 and 420 are further discussed below with reference to FIG. 4B.

Processing logic then generates a number of models for various components in a computer chipset, such as, for example, the package, the stackup, and the connector (processing block 430). In one embodiment, processing logic extracts grounding, referencing, and power distribution information from previous memory interface layout design (processing block 440). Using these information, processing logic performs simulation of the models in time domain (processing block 450).

Figure 4B:
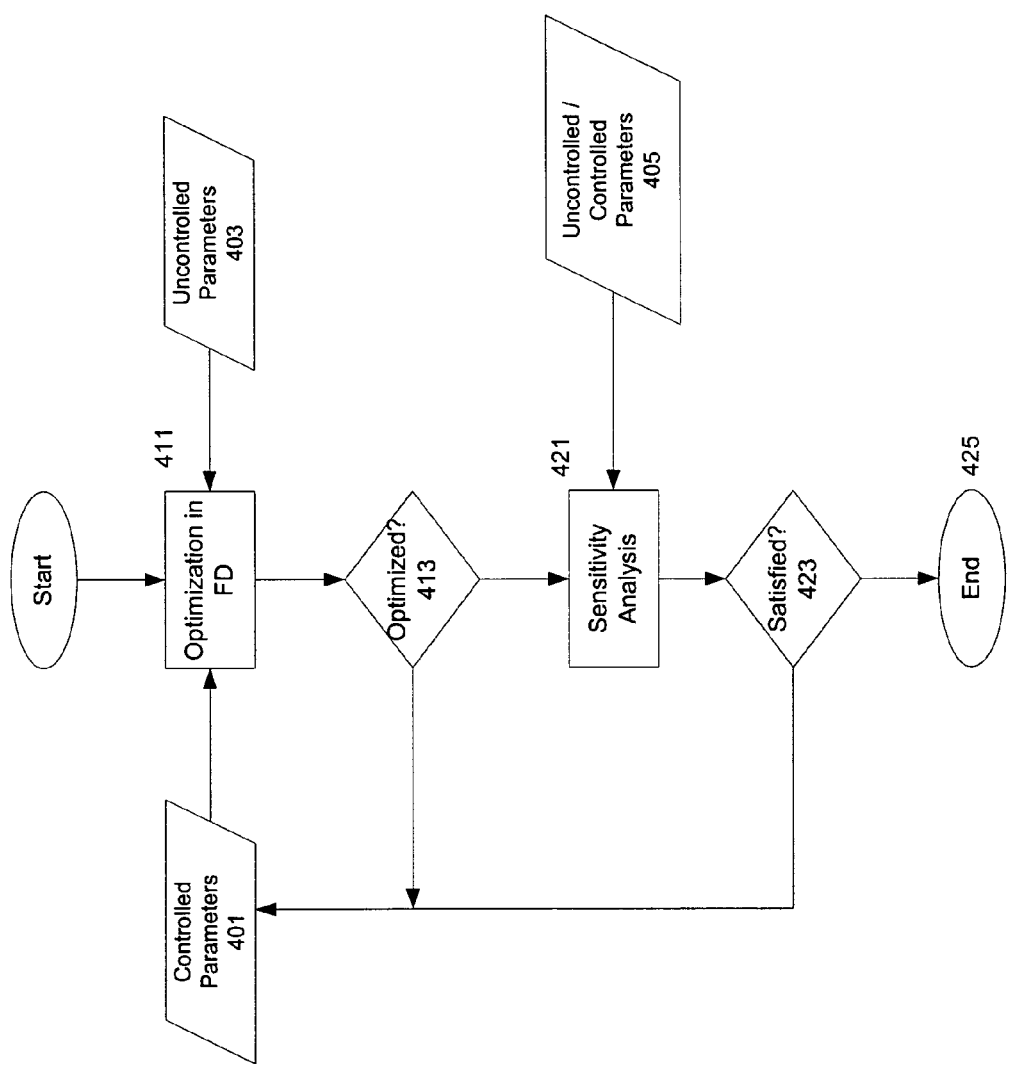
FIG. 4B shows a flow diagram of one embodiment of a process for designing a memory interface.

FIG. 4B shows an embodiment of a process to perform time domain and frequency domain analysis to design a memory interface. The process is performed by processing logic that may comprise hardware (e.g., circuitry, dedicated logic, etc.), software (such as is run on a general purpose computer system or a dedicated machine), or a combination of both. Referring to FIG. 4B, processing logic performs optimization in frequency domain using controlled parameters 401 and uncontrolled parameters 403 (processing block 411). Controlled parameters are parameters that a circuit designer can change, for example, the resistance of a resistor, on die termination (ODT), and transmission line width. On the other hand, uncontrolled parameters are parameters that are set according to feedback from a printed circuit board (PCB) vendor or a PCB designer; such as, for example, dielectric height, dielectric constant, limited signal transmission line width, and the spacing between transmission lines.

In one embodiment, optimization ranges for the controlled parameters are defined in an Advanced Design System (ADS). In one embodiment, goals are set before running the optimization. Examples of the goals include frequency domain fluctuation, resonance alleviation, smaller return loss and cross talk, etc. In one embodiment, performing the optimization includes simulating at different values of the controlled parameters within the ranges set. Processing logic repeats the optimization in frequency domain until an optimized topology of the memory interface is found (processing block 413).

After optimization, processing logic performs sensitivity analysis to confirm the results from the optimization. In one embodiment, processing logic performs time domain matrix reduction using both the controlled and the uncontrolled parameters 405 (processing block 421). Processing logic repeats the sensitivity analysis in frequency domain until an optimized topology of the memory interface is found (processing block 423). Once the goals set are satisfied, processing logic ends the sensitivity analysis (processing block 425). However, processing logic may change the controlled parameters or the optimization range in response to the sensitivity analysis of a certain parameter if the sensitivity of the parameter is beyond a predetermined level. In addition, the sensitivity analysis may provide information for determining the worst-case stackup matrix for a certain motherboard and DIMM impedance combination. In one embodiment, the sensitivity analysis is based on a Gaussian distribution with 5% or 10% standard deviation.

Figure 5:
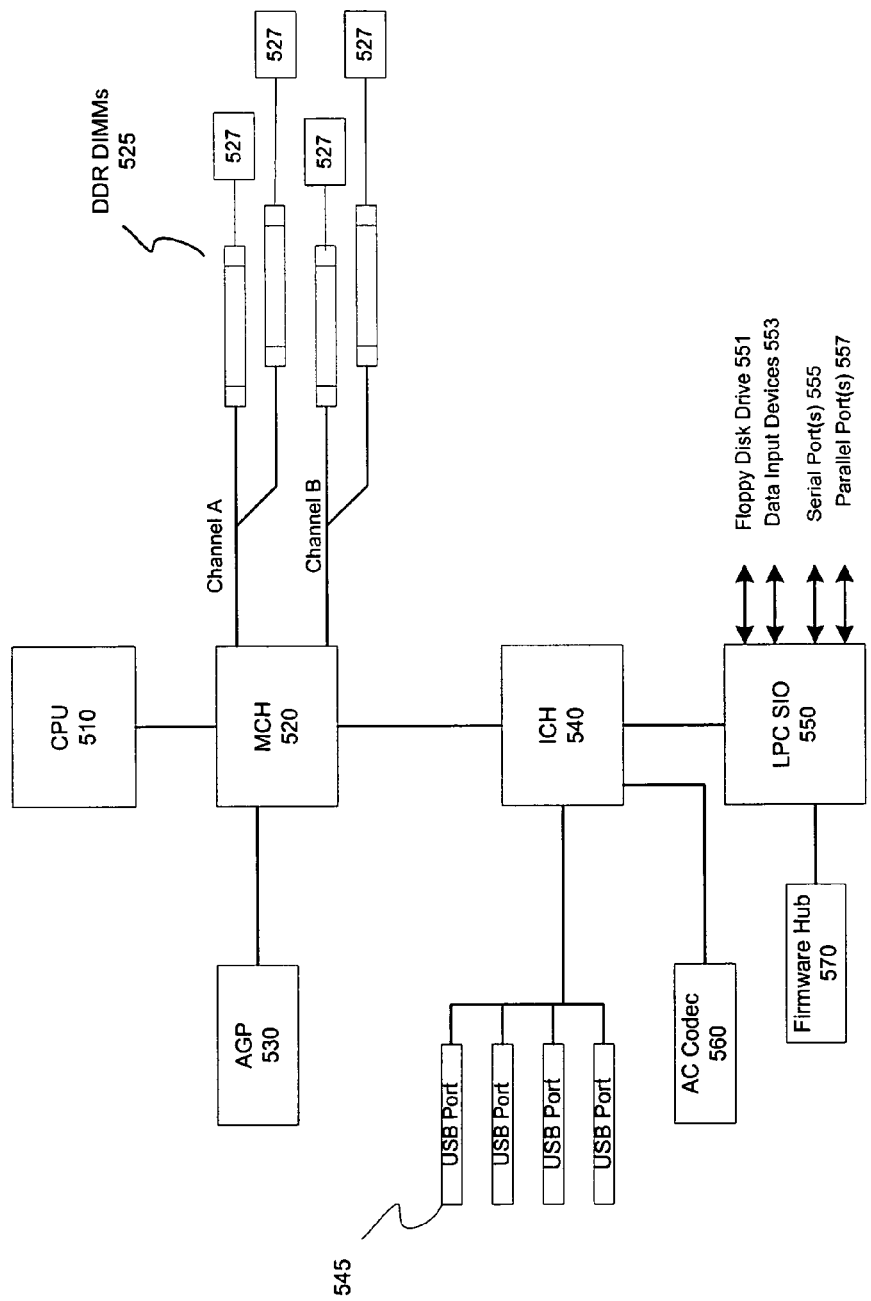
FIG. 5 shows an exemplary embodiment of a computer system.

FIG. 5 shows an exemplary embodiment of a computer system. The computer system 500 includes a central processing unit (CPU) 510, a memory controller (MCH) 520, a number of DDR DIMMs 525, a number of DDR SDRAM devices 527, an advance graphics port (AGP) 530, an input/output controller (ICH) 540, a number of Universal Serial Bus (USB) ports 545, an audio converter codecoder (AC Codec) 560, a switch 550, and a firmware hub 570.

In one embodiment, the CPU 510, the AGP 530, the DDR DIMMS 525, and the ICH 540 are coupled to the MCH 520. The MCH 520 routes data to and from the DDR DIMMs 525, which are further coupled to a number of DDR SDRAM devices 527. However, one should appreciate that other types of memory, such as, DRAM or flash memory, may be used instead of DDR SDRAM. In one embodiment, each of the DDR DIMMs 525 is mounted on the same motherboard (not shown) via a DIMM connector (not shown) in order to be coupled to the MCH 520. In one embodiment, the USB ports 545, the AC Codec 560, and the switch 550 are coupled to the ICH 540. The switch 550 may be further coupled to a firmware hub 570, a floppy disk drive 551, data input devices 553, such as, a keyboard, a mouse, etc., a number of serial ports 555, and a number of parallel ports 557.

Note that any or all of the components and the associated hardware illustrated in FIG. 5 may be used in various embodiments of the present invention. However, it should be appreciated that other configuration of the computer system may include some or all of the devices shown in FIG. 5.

In one embodiment, the DDR DIMMs 525 include a number of transmission lines and an inductor to provide a certain amount of impedance to reduce the timing slew rate of signals and to increase the signal gain through the DDR DIMMs 525. In one embodiment, the inductor is coupled in series with the transmission lines. In one embodiment, the DDR DIMMs 525 further includes a resistor coupled in series with the inductor. Alternatively, the DDR DIMMs 525 may include a single or multi-section impedance transformer, which may be integrated into one or more of the transmission lines in the DDR DIMMs 525.

Although the technique disclosed is applied to the DDR DIMMs 525 shown in FIG. 5 in a multi-drop environment, one should appreciate that the memory interface technique disclosed can also be applied to point-to-point environment.

The foregoing discussion merely describes some exemplary embodiments of the present invention. One skilled in the art will readily recognize from such discussion, the accompanying drawings and the claims that various modifications can be made without departing from the spirit and scope of the appended claims. The description is thus to be regarded as illustrative instead of limiting.

What is claimed is:

1. A memory interface comprising:
   an inductor;
   a resistor coupled to the inductor in series; and
   a plurality of transmission lines, coupled to the inductor in series, to couple a plurality of memory devices to a circuit board.

2. The memory interface of claim 1, further comprising:
   one or more impedance transformers coupled to the inductor in series.

3. The memory interface of claim 2, wherein one or more of the plurality of transmission lines are used as the one or more impedance transformers.

4. The memory interface of claim 1, wherein the plurality of memory devices comprises one or more synchronous dynamic random access memories (SDRAMs) operable at a frequency above 200 Mhz.

5. A method to interface a circuit board with a plurality of memory devices, the method comprising:
   coupling the plurality of memory devices to a semiconductor device by circuitry, the circuitry including an inductor and a resistor coupled to the inductor in series, wherein the circuitry is fabricated on the circuit board and the semiconductor device is a memory controller mounted on the circuit board.

6. The method of claim 5, wherein the circuitry comprises a plurality of transmission lines coupled to the inductor in series on the circuit board.

7. The method of claim 6, wherein the plurality of transmission lines comprises one or more impedance transformers.

8. The method of claim 5, wherein the plurality of memory devices includes one or more synchronous dynamic random access memories (SDRAMs) operable at a frequency above 200 MHz.

9. A computer system comprising:
   a plurality of synchronous dynamic random access memories (SDRAMs);
   a memory controller; and
   a memory interface coupling the memory controller to the plurality of SDRAMs, the memory interface comprising
      an inductor,
      a resistor coupled to the inductor in series, and
      a plurality of transmission lines coupled to the inductor.

10. The computer system of claim 9, wherein the plurality of transmission lines includes one or more impedance transformers.

11. The computer system of claim 9, further comprising a processor coupled to the memory controller.

12. The computer system of claim 9, wherein the plurality of SDRAMs includes a double-data rate (DDR) SDRAM device.

* * * * *